(12) United States Patent
Michaluk

(10) Patent No.: US 7,485,198 B2
(45) Date of Patent: Feb. 3, 2009

(54) TANTALUM AND NIOBIUM BILLETS AND METHODS OF PRODUCING THE SAME

(75) Inventor: Christopher A. Michaluk, Gilbertsville, PA (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 10/042,549

(22) Filed: Jan. 9, 2002

(65) Prior Publication Data

US 2002/0157736 A1 Oct. 31, 2002

Related U.S. Application Data

(60) Provisional application No. 60/261,001, filed on Jan. 11, 2001.

(51) Int. Cl.
*C22C 27/02* (2006.01)

(52) U.S. Cl. .................. 148/422; 420/427; 204/298.15

(58) Field of Classification Search ................. 148/422, 148/668–671, DIG. 158, DIG. 14; 420/425, 420/427; 419/42
See application file for complete search history.

(56) References Cited

U.S. PATENT DOCUMENTS

| | | | | | |
|---|---|---|---|---|---|
| 2,950,185 | A | | 8/1960 | Hellier et al. ................. | 75/0.5 |
| 3,497,402 | A | | 2/1970 | Douglass et al. | |
| 3,767,456 | A | | 10/1973 | Glaski ..................... | 117/71 M |
| 3,829,310 | A | | 8/1974 | Mahy ..................... | 75/0.5 BB |
| 4,141,719 | A | * | 2/1979 | Hakko ....................... | 361/529 |
| 4,149,876 | A | * | 4/1979 | Rerat ......................... | 75/363 |
| 4,684,399 | A | | 8/1987 | Bergman et al. ............. | 75/0.5 |
| 4,844,746 | A | | 7/1989 | Hormann et al. | |
| 5,234,491 | A | | 8/1993 | Chang ........................ | 75/622 |
| 5,242,481 | A | | 9/1993 | Kumar ....................... | 75/364 |
| 5,482,672 | A | * | 1/1996 | Friedman et al. ............. | 419/42 |
| 6,193,821 | B1 | | 2/2001 | Zhang ....................... | 148/668 |
| 6,323,055 | B1 | | 11/2001 | Rosenberg et al. | |
| 6,331,233 | B1 | * | 12/2001 | Turner .................. | 204/298.13 |
| 6,348,139 | B1 | | 2/2002 | Shah et al. | |
| 2001/0001401 | A1 | | 5/2001 | Segal ....................... | 148/670 |
| 2002/0125128 | A1 | | 9/2002 | Turner | |

FOREIGN PATENT DOCUMENTS

| | | | |
|---|---|---|---|
| JP | 62104180 A * | 5/1987 | |
| JP | 1994-264232 | 9/1994 | |
| JP | 11-080942 | 3/1999 | |
| JP | 2000104164 A * | 4/2000 | |
| WO | WO 8707650 A1 * | 12/1987 | |
| WO | WO 99/61670 | 12/1999 | |
| WO | WO 99/66100 | 12/1999 | |
| WO | WO 00/31310 | 6/2000 | |
| WO | WO 01/96620 | 12/2001 | |

OTHER PUBLICATIONS

Clark et al. "Influence of Transverse Rolling on the Microstructural and Textural Development of Pure Tantalum", Metallurgical Transactions A, vol. 23A, Aug. 1992, pp. 2183-2191.*

Schussler, ASM Handbook, vol. 2, 1990, Properties and Selection: Nonferrous Alloys and Secial-Purpose Materials, Pure Metals, Tantalum, pp. 1160-1163.*

Lassila et al., "Mechanical Behavior of Tantalum and Tantalum-Tungsten Alloys: Texture Gradients and Macro/Micro-Response," $14_{th}$ U.S. Army Symposium on Solid Mechanics, Nov. 30, 1996 (14 pgs.).

Michaluk, "Deformation Behavior of Tantalum-Tangsten Alloys,"a Thesis submitted to the Faculty of Drexel University, Dec. 1993 (158 pgs.).

Michaluk et al., "The Effect of Oxygen, Grain Size, and Strain Rate on the Mechanical Behavior of Forged P/M Tantalum," date unknown (pp. 195-204).

Hoge, "Influence of Strain Rate on Flow Stress of Tantalum," Lawrence Radiation Labratory, University of California, Paper 15A. 4, date unknown (pp. 996-1000).

Follansbee, "The Hopkinson Bar," High Strain Rate Testing, date unknown (pp. 198-203).

Rudolph et al., "The Deformation of Tantalum-Niobium and Tantalum-Molybdenum Single Crystals," Z. Metallkde., No. 58, H. 10, 1967 (pp. 708-713).

Regazzoni et al., "Influence of Strain Rate on the Flow Stress and Ductility of Copper and Tantalum at Room Temperature," Inst. Phys. Conf. Ser. No. 70, paper presented at $3^{rd}$ Conf. Mech. Prop. High Rates of Strain, Oxford, 1984 (pp. 63-70).

(Continued)

*Primary Examiner*—Roy King
*Assistant Examiner*—Lois L. Zheng

(57) ABSTRACT

Extruded tantalum billets and niobium billets are described having a substantially uniform grain size and preferably an average grain size of about 150 microns or less and more preferably an average grain size of about 100 microns or less. The extruded billet can then be forged or processed by other conventional techniques to form end use products such as sputtering targets. A process for making the extruded tantalum billets or niobium billets is also described and involves extruding a starting billet at a sufficient temperature and for a sufficient time to at least partially recrystallize the billet and form the extruded billet of the present invention.

60 Claims, 10 Drawing Sheets

OTHER PUBLICATIONS

Diaz et al., "Evidence for Slow Strain-Rate Embrittlement in Tantalum Due to Oxygen," Scripta Metallurgica, vol. 13, 1979 (pp. 491-496).

Author unknown, "Reihenentwicklung von Orientierungsverteilungskunktionen," date known (pp. 24-25) (in German).

Mundekis et al., "Effects of Rolling Schedule and Annealing on the High Strain Rate Behavior of Tantalum," The Minerals, Metals & Materials Society, 1992 (pp. 77-96).

Arsenault et al., "Work-Hardening Characteristics of Ta and Ta-Base Alloys," date unknown (pp. 283-301).

Landrum et al., "The Effects of Cold-Flowing on Tantalum Material Properties," The Minerals, Metals & Materials Society, 1992 (pp. 59-76).

Keh et al., "Deformation Substructure in Body-Centered Cubic Metals," Single Phase Materials, Chapter 5, date unknown (pp. 231-264).

Gourdin et al., "The Influence of Tungsten Alloying on the Mechanical Properties of Tantalum," Journal De Physique IV, Colloque C8, vol. 4, Sep. 1994 (pp. C8-207-C8-212).

Author unknown, "Solid Solutions," Chapter 6, date unknown (pp. 144-149).

Lassila et al., "Effects of Shock Prestrain on the Dynamic Mechanical Behavior of Tantalum," Journal De Physique IV, Colloque C3, vol. 1, Oct. 1991 (pp. C3-19-C3-26).

Ulitchny et al., "The Effects of Interstitial Solute Additions on the Mechanical Properties of Niobium and Tantalum Single Crystals," Journal of the Less-Common Metals, vol. 33, 1973 (pp. 105-116).

Pokross, "Tantalum Micro-Alloys," supplied by the British Library, date unknown (pp. 297-330).

Hull et al., "Introduction to Dislocations," 3rd Edition, 1984 (cover page & contents pages v-vii only).

Author unknown, "Mechanical Fundamentals," Dieter Mech. Metallurgy, 3rd Ed., 1986 (pp. 82-86).

Gray et al., "The High-Strain-Rate and Spallation Response of Tantalum, Ta-10W, and T-111," The Minerals, Metals & Materials Society, 1992 (pp. 303-315).

Rajendran et al., "Effects of Strain Rate on Plastic Flow and Fracture in Pure Tantalum," J. Mater. Shaping Technol., vol. 9, 1991 (pp. 7-20).

Cardonne et al., "Tantalum and its Alloys," Advanced Materials & Processes, vol. 142, No. 3, Sep. 1992 (pp. 16-20).

Pokross, "Tantalum," Metals Handbook, 10th Ed., vol. 2, Properties and Selection: Nonferrous Alloys and Special-Purpose Materials, 1990 (pp. 571-574).

Raman et al., "Rapid Consolidation of Tantalum: Non Conventional Microstructure and Resultant Dynamic Mechanical Properties," supplies by the British Library, date unknown (pp. 559-571).

Barbee et al., "Dislocation Structures in Deformed and Recovered Tantalum," Journal of the Less-Common Metals, vol. 8, 1965 (pp. 306-319).

Fujii et al., "On the Rolling Deformation and Recrystallization of (111) [112]Single Crystals of High-Purity Tungsten, Molybdenum and Tantalum," Journal of the Less-Common Metals, vol. 39, 1975 (pp. 161-172).

Welch et al., "Consideration of Anisotropy Parameters in Polycrystalline Metals," Z. Metallkde, Bd. 74, H. 4, 1983 (pp. 233-237).

Arsenault, "Effects of Strain Rate and Temperature on Yield Points," Transactions of the Metallurgical Society of AIME, vol. 230, Dec. 1964 (pp. 1570-1576).

Gray et al., "Influence of Peak Pressure and Temperature on the Structure/Property Response of Shock Loaded Ta and Ta-10W," Metallurgical and Materials Transactions A, vol. 26A, Oct. 1995 (pp. 2555-2563).

Giannotta et al., "Ductility and Flow Rule of Tantalum at 20° C and 500° C," Journal De Physique, Colloque C5, No. 8, Tome 46, Aug. 1985 (pp. C5-49-54).

Ferriss et al., "Deformation of Tantalum Single Crystals,"Transactions of the Metallurgical Society of AIME, vol. 224, Oct. 1962 (pp. 975-981).

Mitchell et al., "Mechanical Properties of Some Tantalum Alloys," Canadian Journal of Physics, vol. 45, 1967 (pp. 1047-1062).

Arsenault, "An Investigation of the Mechanism of Thermally Activated Deformation in Tantalum and Tantalum-Base Alloys," ACTA Metallurgica, vol. 14, Jul. 1966 (pp. 831-838).

Zerilli et al., "Description of Tantalum Deformation Behavior by Dislocation Mechanics Based Constitutive Relations," J. Appl. Phys. vol. 68, No. 4, Aug. 15, 1990 (pp. 1580-1591).

Michaluk et al., "The Effects of Texture and Strain on the R-Value of Heavy Gauge Tantalum Plate," Materials Science Forum, vol. 157-162, 1994 (pp. 1653-1662).

Spitzig et al., "Dislocation Arrangements in Tantalum Single Crystals Deformed in Tension at 373°K," ACTA, Metallurgica, vol. 14, Oct. 1966 (pp. 1311-1323).

Hoge et al., "The Temperature and Strain Rate Dependence of the Flow Stress of Tantalum," Journal of Materials Science, vol. 12, 1977 (pp. 1666-1672).

Fyfe et al., "Dynamic Pre-Strain and Inertia Effects on the Fracture of Metals," J. Mich. Phys. Solids, vol. 28, 1980 (pp. 17-26).

Pappu et al, "High-Strain-Rate Behavior of Pure Tantalum in Explosively Formed Penetrator and Shaped Charge Regimes," Metallurgical and Materials Applications of Shock-Wave and High-Strain-Rate Phenomena, 1995 (pp. 495-502).

Wright et al., "Texture Gradient Effects in Tantalumm," Materials Science Forum, vol. 157-162, 1994 (pp. 1695-1700).

Mitchell et al., "Three-Stage Hardening in Tantalum Single Crystals," ACTA Metallurgica, vol. 13, Nov. 1965 (pp. 1169-1179).

Suzuki, "Development of Refractory Metals and Silicides Targets, and Their Characteristics," Materials Research Society, 1987 (pp. 339-345).

Ohba et al., "Effect of Zone-Refining on Orientations of Recrystallized Grains Formed in Rolled and Annealed Pure Mo and Ta Single Crystals," Journal of the Less-Common Metals, vol. 52, 1977 (pp. 93-99).

Fujii et al., "On the Deformation and Recrystallization of (001)[110] Single Crystals of Pure Tungsten Rolled at 200° C. and Tantalum at 100° C.," Trans. Jim, vol. 16, 1975 (pp. 219-224).

Kaneko et al., "Mechanical Properties of Ta Single Crystals Grown By Electron Beam Melting Methods," publication and date unknown (Abstract in English).

Kaneko, "The Effect of Crystallographic Orientation on Mechanical Properties of Ta Single Crystals Grown by Electron Beam Melting Methods," publication and date unknown (pp. 22-30) (Abstract in English).

Singh, "Ultrapurification of Refractory Metals," High Temperature Materials and Processes, vol. 11, Issue 1-4, Jan. 1993 (pp. 305-349).

Izumi, "Processing of Ta Powder and Mill Products at Showa-Cabot Supermetal Higashi-Nagahara Plant," Shigen-To-Sozai, vol. 109, 1993 (pp. 1181-1186).

Okamoto et al., "Determination of Th, U, Na and K in High-Purity Tantalum," Journal of the Iron and Steel Institute of Japan, 1991 (pp. 1929-1935) Synopsis in English).

Park et al., "Determination of Impurities in Tantalum by a Radiochemical Neutron Activation Analysis," Journal of Radioanalytical and Nuclear Chemistry, Articles, vol. 168, No. 2, 1993 (pp. 497-502).

Krivan et al., "Analysis of Tantalum by IICP-AES Involving Trace-Matrix Separation," Fresenius J. Anal. Chem., vol. 341, 1991 (pp. 550-554).

Takahashi et al., "Determination of Impurities in High Purity Tantalum by inductively Coupled Plasma Atomic Emission Spectrometry with Ion Exchange Method," Kawasaki Steel GIHO, vol. 21, No. 2, 1989 (pp. 119-123).

Izumi, "Improvement in Characteristics of High Purity Tantalum by Doping and Embrittlement Mechanism of Tantalum Wire Used in Tantalum Capacitors," publication and date unknown (pp. 59-84) (in Japanese with English translation, pp. 24-51).

Materials for Evaporation & Sputtering, Materials Research Corporation, Third Edition, Nov. 1980 (pp. 1-24).

Gruber et al., "Electron Beam Melting with Multiple Guns," Transactions of the Eighth National Vacuum Symposium, Combined With the Second Int'l. Congress on Vacuum Science and Technology, vol. 2, Oct. 16-19, 1961 (pp. 722-731).

Choi et al., "Textures of Tantalum Metal Sheets by Neutron Diffraction," Journal of Materials Science, vol. 28, 1993 (pp. 3283-3290).

Sibley et al., "Experience with an Electron Beam Melting Furnace," publication and date unknown (pp. 714-721).

Clark et al., "Influence of Transverse Rolling on the Microstructural and Texture Development in Pure Tantalum," Metallurgical Transactions A, vol. 23A, Aug. 1992 (pp. 2183-2191).

Clark et al., "Influence of Initial Ingot Breakdown on the Microstructural and Textural Development of High-Purity Tantalum," Metallurgical Transactions A, vol. 22A, Dec. 1991 (pp. 2959-2968).

Pokross, "Controlling the Texture of Tantalum Plate," JOM, Oct. 1989 (pp. 46-49).

Kumar et al., "Corrosion Resistant Properties of Tantalum," Corrosion 95, Paper No. 253, 1995 (pp. 253/1-253/16).

Clark et al., "Effect of Processing Variables on Texture and Texture Gradients in Tantalum," Metallurgical Transactions A, Vol. 22A, Sep. 1991 (pp. 2039-2048).

Wright et al., "Textural and Microstructural Gradient Effects on the Mechanical Behavior of a Tantalum Plate," Metallurgical and Materials Transactions A, vol. 25A, May 1994 (pp. 1025-1031).

Feng et al., "Texture in Cold-Rolled Ta Ingot," JOM, Oct. 1989 (pp. 40-45).

Michaluk, "Factors Affecting the Mechanical Properties and Texture of Tantalum," The Minerals, Metals & Materials Society, 1996 (pp. 205-217).

Hashimoto et al., "High Quality $Ta_2O_5$ Films Using Ultra-High Purity Ta Sputtering Target," Extended Abstracts of the 18th (1986 International) Conference on Solid State Devices and Materials, Tokyo, 1986 (pp. 253-256).

Mundekis, "Effects of Rolling Schedule and Annealing on the High Strain Rate Behavior of Tantalum," paper presented at TMS meeting in Cincinnati, Ohio in 1991 (23 pages).

Cardonne et al., "Refractory Metals Forum: Tantalum and its Alloys," Advanced Materials and Processes, Sep. 1992 (pp. 16-20).

Cardonne et al., "Tantalum and its Alloys," Int. J. of Refractory Metals and Hard Materials, No. 13, 1995 (pp. 187-194).

Anderson, "Atom Ejecton in Low Energy Sputtering of Single Crystals of bcc Metals," Journal of Applied Physics, vol. 34, No. 3, Mar. 1963 (pp. 659-663).

Erginsoy et al., "Dynamics of Radiation Damage in a Body-Centered Cubic Lattice," Physical Review, vol. 133, No. 2A, Jan. 20, 1964 (pp. A595-A606).

Kirk-Othmer, Encyclopedia of Chemical Technology, 3rd Edition, vol. 22, pp. 541-564, 1983.

S.I. Wright, G.T. Gray, and A.D. Rollett, *Textural and Microstructural Gradient Effects on the Mechanical Behavior of a Tantalum Plate, Metallurgical and Materials Transactions A,* 25A, pp. 1025-1031, 1994.

C.A. Michaluk, R.O. Burt, and D.P. Lewis, *Tantalum 101: Economics and Technology of Ta Materials, Semiconductor International,* vol. 23, No. 8, pp. 271-278, 2000.

C.A. Michaluk, *Correlating Discrete Orientation and Grain Size to the Sputter Deposition Properties of Tantalum, Journal of Electronic Materials,* vol. 31, No. 1, pp. 2-9, 2002.

G. I. Friedman, "Grain Size Refinement in a Tantalum Ingot", Metallurgical Transactions., vol. 2, Jan. 1971(1971-01), pp. 337-341, XP002227180 Metallurgical Society of AIME. New York., US. p. 337, column 1,line 1-p. 340, col. 2, line 28; table 4.

S. R. Lampman et al., "Metals Handbook, vol. 2", 1990 ASM International, Ohio, US XP002227181, "Niobium", Gerardi. p. 565-574.

International Search Report for PCT/US02/23640, Jan. 23, 2003.

Translation of Notice of Reasons for Rejection in counterpart Japanese Patent Application No. 2002-585689 dated Dec. 5, 2007 (5 pages).

The Examiner's Grounds for Rejection in counterpart Korean Patent Application No. 10-2003-7009209 dated Jan. 18, 2008 with English translation (8 pages).

Friedman, "Grain Size Refinement in a Tantalum Ingot," Metallurgical Transactions, vol. 2, Jan. 1971, pp. 337-341.

* cited by examiner

| PROCESS | SAMPLE LOCATION | 950°C ANNEAL X 2 HOURS | | |
|---|---|---|---|---|
| | | Average Grain Size (μm) | Grain Size Range | Recrystallize (Percent) |
| Commercial Process | Center | 46 | <10-240 | 95 |
| Commercial Process | Edge | 40 | <10-250 | 99 |
| 9.5"Ø, Extrude 1800°C | Center | 33 | <10-240 | 80 |
| 9.5"Ø, Extrude 1800°C | Edge | 35 | 10-290 | 65 |
| 9.5"Ø, Extrude 1850°C | Center | 33 | 10-180 | 50 |
| 9.5"Ø, Extrude 1850°C | Edge | 35 | <10-225 | 98 |
| 9.5"Ø, Extrude 1900°C | Center | 32 | 10-110 | 65 |
| 9.5"Ø, Extrude 1900°C | Edge | 28 | <10-200 | 85 |
| 10.25"Ø, Extrude 1900°C | | | | |
| 10.25"Ø, Extrude 1900°C | | | | |

FIG. 2(A)

| PROCESS | 1050°C ANNEAL X 2 HOURS | | | 1150°C ANNEAL X 2 HOURS | | |
|---|---|---|---|---|---|---|
| | Average Grain Size (μm) | Grain Size Range | Recrystallize (Percent) | Average Grain Size (μm) | Grain Size Range | Recrystallize (Percent) |
| Commercial Process | 60 | 20–245 | 76 | | | |
| Commercial Process | 60 | 10–155 | 100 | | | |
| 9.5"∅, Extrude 1800°C | 45 | 10–150 | 95 | 60 | 10–150 | 100 |
| 9.5"∅, Extrude 1800°C | 35 | 10–135 | 100 | 75 | 10–200 | 100 |
| 9.5"∅, Extrude 1850°C | 65 | <10–110 | 100 | 75 | 10–110 | 100 |
| 9.5"∅, Extrude 1850°C | 63 | <10–110 | 100 | 62 | 10–145 | 100 |
| 9.5"∅, Extrude 1900°C | 32 | 10–180 | 100 | 86 | 10–145 | 100 |
| 9.5"∅, Extrude 1900°C | 32 | <10–90 | 99 | 122 | 10–135 | 100 |
| 10.25"∅, Extrude 1900°C | 35 | 10–80 | 99 | 56 | 10–135 | 100 |
| 10.25"∅, Extrude 1900°C | 38 | <10–110 | 100 | 70 | 10–160 | 100 |

FIG. 2(B)

TANTALUM AND NIOBIUM BILLETS AND METHODS OF PRODUCING THE SAME

This application claims the benefit under 35 U.S.C. § 119 (e) of prior U.S. Provisional Patent Application No. 60/261,001 filed Jan. 11, 2001, which is incorporated in its entirety by reference herein.

BACKGROUND OF THE INVENTION

The present invention relates to tantalum and niobium metals and methods of forming products from tantalum and/or niobium, such as tantalum billets or niobium billets. The present invention further relates to tantalum billets or niobium billets that have a fine, uniform microstructure including a uniform grain size.

Metal billets, such as tantalum billets are commercially available from a variety of manufacturers. Typically, these billets are defined by their minimum thickness and/or aspect ratio. Typical billets are cylindrical in shape and have a diameter of 2½ inches or more and/or have an aspect ratio of L/D of greater than 0.5. Thus, billets are not metal plates or slabs and are typically an intermediate product formed from an ingot, such as a tantalum ingot. Tantalum billets are then typically further processed by means such as forging into other forms used by a variety of end users for such uses as sputtering targets and the like. The tantalum billets provided to these end users typically do not have a fine and uniform grain size. Instead, commercially produced tantalum billets have a grain structure that varies between the center and edge of the billet. The center of the commercial tantalum billet typically has a microstructure composed of broad bands of larger, elongated grains adjacent to regions of varying fine grain size or of unrecrystallized material. Conversely, the outer portions of the commercial tantalum billets have a relatively fine and uniform grain structure compared to the center of the billet. Thus, products forged from billets having a coarse, non-uniform grain structure may also exhibit a coarse, non-uniform grain structure. For many high performance applications for tantalum such as sputtering targets and chemical energy munition warheads, a non-uniform grain structure has been reported to detrimentally impact product performance (S. I. Wright, G. T. Gray, and A. D. Rollett, *Textural and Microstructural Gradient Effects on the Mechanical Behavior of a Tantalum Plate, Metallurgical and Materials Transactions A*, 25A, pp.1025-1031, 1994; C. A. Michaluk, R. O. Burt, and D. P. Lewis, *Tantalum 101: Economics and Technology of Ta Materials, Semiconductor International*, Vol. 23, No.8, pp.271-278, 2000; C. A. Michaluk, *Correlating Discrete Orientation and Grain Size to the Sputter Deposition Properties of Tantalum, Journal of Electronic Materials*, Vol. 31, No. 1, pp.2-9, 2002), all incorporated in their entirety by reference herein.

Accordingly, there is a need to provide tantalum and niobium billets having a uniform grain size and preferably made from high purity tantalum and/or niobium. In addition, there is a need to provide methods to make such a tantalum billet or niobium billet.

SUMMARY OF THE PRESENT INVENTION

A feature of the present invention is to provide tantalum billets or niobium billets having a substantially uniform grain size.

Another feature of the present invention is to provide methods to make tantalum billets or niobium billets having a substantially uniform grain size.

Another feature of the present invention is to provide intermediate billet products which can be used to form end use products such as sputtering targets wherein the end use products as well as the intermediate billet products have a substantially uniform grain size.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a tantalum billet having a substantially uniform grain size. Preferably, the tantalum billet has an average grain size of about 150 microns or less. In addition, preferably the purity of the tantalum in the billet is at least 99.95%. The billet of the present invention alternatively can be niobium with the same characteristics.

The present invention further relates to sputtering targets formed from the above-described tantalum billets or niobium billets of the present invention.

Also, the present invention relates to a method of forming a tantalum billet having substantially uniform grain size and involves taking a tantalum ingot and cutting the ingot into large billets. The large billets are either placed into a can which is then evacuated and sealed, or the billets are coated with a protective coating, which protects the large billets from oxidation during subsequent thermal processing and can also serve as a lubricant during subsequent extrusion operations. The large billets are next heated at a sufficient temperature to ensure at least the partial recrystallization of the extruded tantalum billet and preferably the full recrystallization of the tantalum billet. Afterwards, the can or protective coating can be removed and the extruded rod, if desired, can be cut into smaller billets or pieces and further processed by conventional methods, such as forging and the like. Again, the same steps can be used to form niobium billets.

It is to be understood that both the foregoing general description and the following detailed description are exemplary and explanatory only and are intended to provide a further explanation of the present invention, as claimed.

BRIEF DESCRIPTION OF THE DRAWINGS

FIGS. 2(A) and 2(B) provide tables showing experimental results relating to various parameters for certain materials made or used in the examples of the present application.

DETAILED DESCRIPTION OF THE PRESENT INVENTION

Figure 1:
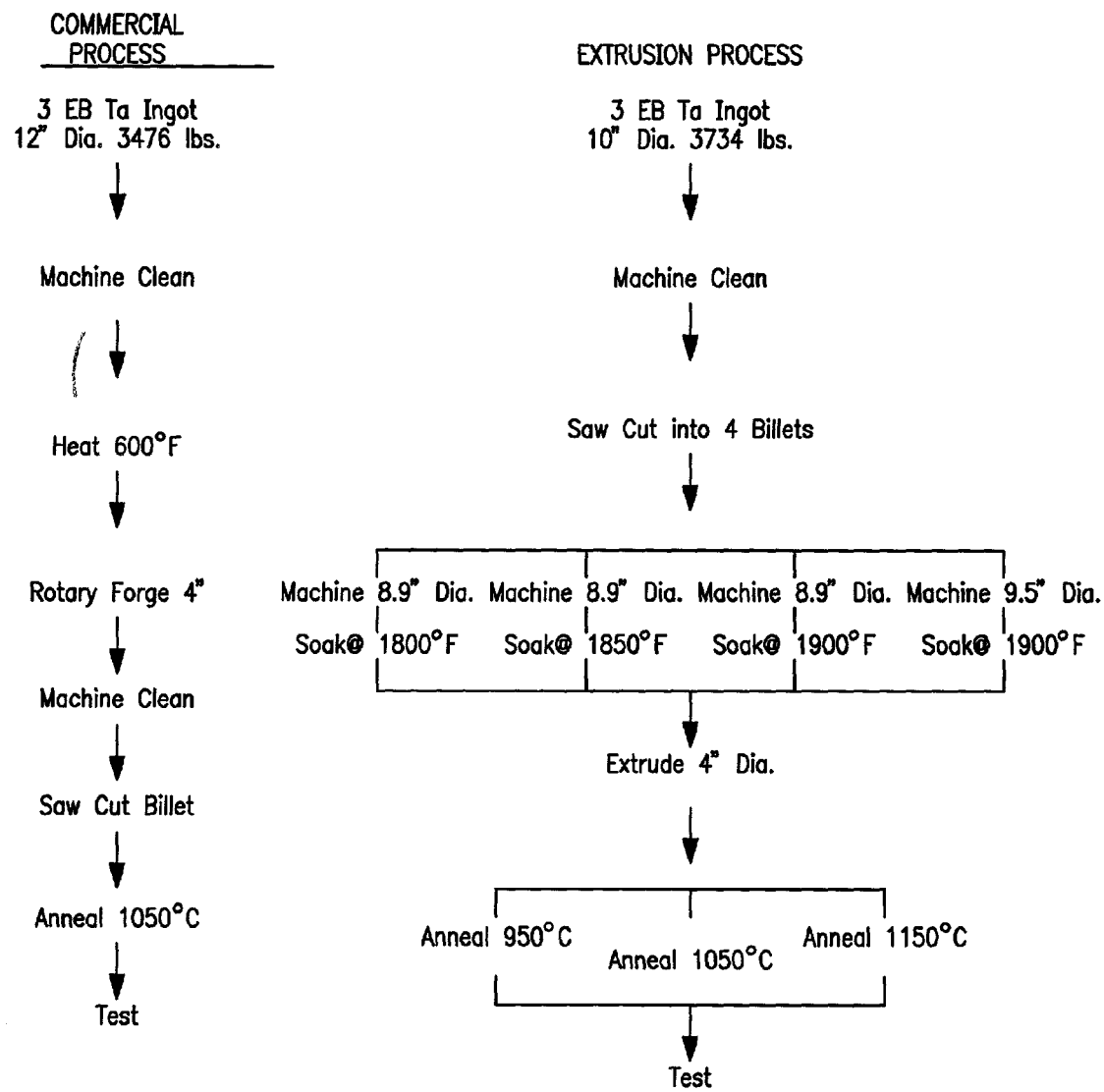
FIG. 1 is a flowchart showing a typical commercial process compared to a preferred embodiment of the process of the present invention.

The present invention relates to tantalum billets and/or niobium billets having a substantially uniform grain size. For purposes of this invention, billets are cylindrical in shape or can be shapes other than circular cylinders such as forms having an oval, square, rectangular, or polygonal cross-section. The present invention further relates to products formed from the tantalum billets and/or niobium billets such as sputtering targets and the like. Also, the present invention relates to methods of making the tantalum billets and niobium billets of the present invention.

With respect to the tantalum billet or the niobium billet, preferably, the billet has a substantially uniform grain size. More preferably, the billet has a uniform grain size throughout the diameter and length of the billet. For purposes of the present invention, a substantially uniform grain size, measured in accordance to ASTM-E112, determined about any incremental area throughout the cross section of the extruded billet, does not deviate by more than about +/−100 microns from the average ASTM grain size determined across the entire cross section of the extruded billet. In addition, the size of the grains about the cross section of the extruded billet preferably vary uniformly in accordance to a normal or Poissons distribution, and preferably does not exhibit a duplex microstructure as evident by a bimodal grain size distribution. Furthermore, the aspect ratio of the longitudinal grains preferably does not exceed 20. Longitudinal grains are defined as those contained within any plane within the billet whose pole is perpendicular to the extrusion direction.

The extruded and annealed billet preferably exhibits a partially recrystallized microstructure. More preferably, the billet is more than 80% recrystallized, and most preferably the extruded billet is more than 99% recrystrallized. The annealed billet, in addition, preferably has an average grain size of about 150 microns or less, though other grain sizes are within the bounds of the present invention. More preferably, the average grain size of the tantalum billet or the niobium billet of the present invention is about 150 microns or less and even more preferably about 100 microns or less, and most preferably about 50 microns or less. A preferred average grain size range is from about 25 to about 150 microns and more preferably an average grain size range of from about 25 microns to about 100 microns. The billets of the present invention preferably have a fine, uniform microstructure.

Preferably, the extruded billets of the present invention also have excellent texture characteristics, which are especially suitable for such uses as sputtering targets.

The tantalum present in the tantalum billet preferably has a purity of at least 99.5% though other purities lower or higher than this can be used. More preferably, the tantalum metal has a purity of at least 99.95% and can range in purity from about 99.5% to about 99.999% or more. Other ranges include from about 99.99% to about 99.995% and from about 99.995% to about 99.999% and from about 99.999% to about 99.9995%. The tantalum that is present in the billet of the present invention can further include other metals and thus be a tantalum alloy billet which preferably comprises the high purity tantalum metal as one of the components of the alloy. Other components which can form the tantalum alloy billet of the present invention include, but are not limited to, yttrium, niobium, tungsten, molybdenum, titanium, silicon, hafnium, iron, nickel, chromium, and the like. The high purity tantalum that can be used to form the tantalum billet of the present invention can be obtained following the procedures described in International Published Application No. WO 00/31310 which is incorporated herein in its entirety. Similar purity levels are preferred with niobium.

As described above, for purposes of the present invention, a tantalum or niobium billet preferably has a cylindrical shape and has a diameter that is 2½ inches or greater. Another way to describe the billet of the present invention is that the aspect ratio L/D is greater than 0.5 and preferably is 1.0 and more preferably is 2.0. The billet of the present invention in a preferred embodiment preferably has a diameter of from about 3 inches to about 5 inches and more preferably from about 3½ inches to about 4½ inches, and even more preferably about 3⅞ inches with the billet having any height such as, but not limited to, 5 to 7 inches.

As stated earlier, the billets of the present invention can then be subsequently formed into end use products such as sputtering targets by cutting the billets into desired sizes and then upset forging the billets into disks which can then be used as planar sputtering targets. In addition, the billets can be rolled to produce sheet or plate. The billets of the present invention can also be used for a variety of other uses such as, but not limited to, hollow cathode magnetron (HCM) sputtering targets, chemical energy (CE) warhead liners, and feedstock for deep-drawing applications such as cups, crucibles, and drawn seamless tubes, and the like.

Essentially, the billets of the present invention can be used in the same manner as conventional tantalum and niobium billets except the billets of the present invention have the improved properties with respect to uniform grain size and preferably a small average grain size, such as about 150 microns or less which leads to a variety of desired properties such as, but not limited to, more homogeneous deformation and work hardening throughout the workpiece during subsequent processing. This, in turn, allows for a reduction in the temperature of subsequent annealing operations and allows for the attainment of a finer, more homogeneous microstructure in the final formed product than could otherwise be realized by conventional processing.

The billets of the present invention are preferably made as follows. Preferably, a tantalum ingot or niobium ingot is obtained and cut into large billet sizes such as from 6 to about 14 inches and more preferably from about 8 to 11 inches in diameter and most preferably about ten inches in diameter with the length being any length. Examples of suitable lengths include, but are not limited to, from about 10 to about 40 inches and more preferably from about 15 to about 30 inches. This billet would be the starting billet size prior to converting this billet into the tantalum or niobium billet of the present invention.

Preferably, this starting billet is then either placed in a metal can which can be evacuated and sealed, or the billet can be coated with a protective coating. The metal can or protective coating preferably prevents the oxidation of the surface of the billet and acts as a lubricant during the subsequent processing. Thus, any suitable can or protective coating can be used as long it will prevent or reduce oxidation of the surface of the billet and will not deteriorate during subsequent processing steps. A suitable protective coating would be a copper coating which can be applied by conventional techniques such as flame spraying. Depending upon the extrusion temperatures discussed below, other protective coatings, such as glass-based coatings, may be employed. At substantially high extrusion temperatures, a high melting point metal can be used in combination with a glass coating. For instance, a metal can, such as molybdenum, can be used to protect the tantalum or niobium from contamination during soaking and extruding operations, while the glass coating provides lubrication. Following extrusion, the glass particles are embedded in the inexpensive can metal and not in the tantalum or niobium billet. The glass contaminants can then be removed by machining the can metal without having to machine the underlying tantalum or niobium billet, resulting in an increased yield of the more expensive tantalum or niobium material.

Once the can is in place or the protective coating is preferably applied, the starting billet can be heated at a sufficient temperature and for a sufficient time to assure that the deformation and stored energy is uniformly distributed in the workpiece during and after extrusion, and preferably cause at least the partial dynamic recrystallization and most preferably the full recrystallization of the billet during extrusion. As an example, a conventional extruder can be used for extruding metals having a liner size equal to or greater than the length and diameter of the pre-extruded billet plus the can or protective coating. As an example, an extrusion die fabricated from hardened steel having a taper of about 45° and an inside diameter of about 4 inches can be used. The extrusion die set, prior to introduction of the starting billet can be generally heated to a temperature near the billet soak temperature to prepare for extrusion. Suitable temperatures include, but are not limited to, temperature ranges of from about 1200° F. to about 2950° F., and preferably about 1800° F.-1900° F. for tantalum. Once the billet is heated for a sufficient time so that the center of the billet is at or near the soak temperature, then the starting billet can then be introduced into the extruder and extruded.

Typically, the extruder utilizes ram speeds of from about 0.1 to about 10 inches/second, depending upon the capabilities of the extrusion machine. In the preferred embodiment, if the starting billet has a diameter of about 10 inches, the extrusion preferably reduces the diameter of the billet to about 3 to 4 inches. The combination of soaking the billet at an elevated temperature and the subsequent adiabatic heating incurred during extrusion leads to the partial recrystallization and preferably to the full recrystallization of the billet. The resultant billet preferably contains a substantially uniform grain size throughout the billet with a preferred average grain size of about 150 microns or less and more preferably an average grain size of about 100 microns or less. The billet can be produced by a single pass through the extruder, or by a progression of extrusion operations, or by a combination of extrusion and conventional deformation processes.

After exiting the extruder, the extruded billet is preferably allowed to air-cool, or optionally can be water-quenched to quickly reduce the temperature of the extruded billet and prevent grain growth. In the preferred method, the can metal or protective coating can then be removed by dissolving in acid, or machine cleaning, or any other type of technique used to remove coatings from metals.

Once the protective coating or can is removed, the extruded billet is preferably annealed to attain a partially recrystallized microstructure, and most preferably to achieve a fully recrystallized grain structure with a homogenous or uniform grain size and preferably an average grain size of 150 microns or less and more preferably under 100 microns. The annealing can occur at any temperature to achieve desired levels of recrystallization, such as from about 950° C. or less to about 1150° C. or more, and preferably occurs in a vacuum, such as at least $1 \times 10^{-4}$ Torr. The annealing time can be for 2 hours or other suitable times, more than or less than 2 hours. The annealing process preferably includes conventional acid pickling or other surface cleaning techniques prior to annealing to remove any surface contaminants. The billet can then be cut into smaller pieces as described above and processed into end use products as with any type of conventional billets. For instance, the billet of the present invention can be forged to a disk and used as a sputtering target. As stated earlier, with the extruded billet of the present invention having a substantially uniform grain size as well as a fine grain size, the end use products formed from the billets have the same excellent properties which are beneficial for the reasons stated earlier.

As an option or alternative embodiment, the extrusion of the billets can occur in the manner described above but the extruded billet does not need to be at least partially recrystallized by the extrusion process. When recrystallization does not need to occur during the extrusion process, the extrusion can occur at any temperature such as from about ambient or room temperature (e.g., 20° C.-25° C.) to temperatures below the melting point of the tantalum or niobium. Preferably, the extrusion temperature is from about 1200° F. to about 5400° F. for tantalum. If extrusion occurs with very little recrystallization occurring in the extruded billet or does not occur at all, the extruded billet can then be preferably subjected to one or more annealing steps in order to cause at least partial, if not full recrystallization of the extruded billet. The annealing temperature is a temperature sufficient to cause at least partial recrystallization of the extruded billet and preferably full recrystallization of the extruded billet. Preferred annealing temperatures are from about 950° C. to about 1150° C. with respect to tantalum, for a preferred annealing time of 2 hours. As indicated above, it is preferred to subject the extruded billet to conventional cleaning steps such as conventional acid pickling prior to any annealing to remove any surface contaminants.

The ingot which is used to form the billets of the present invention can be obtained by conventional techniques used to form tantalum or niobium ingots. For instance, the tantalum can be obtained from ore and subsequently crushed and the tantalum separated from the crushed ore through the use of an acid solution and a density separation of the acid solution containing the tantalum from the acid solution containing niobium and other impurities. The acid solution containing the tantalum can then be crystallized into a salt and this tantalum containing salt is then reacted with pure sodium in a vessel having an agitator typically constructed of nickel alloy material wherein the salt is then dissolved in water to obtain tantalum powder which can then be melted by a variety of melting techniques such electron beam melting, vacuum arc remelting, or plasma melting.

Preferably, the starting ingot used to form the starting tantalum billet is a high purity tantalum ingot. Generally, a process that can be used to make the high purity tantalum metal of the present invention involves a refining process, a vacuum melting process, and a thermal mechanical process. In this process or operation, the refining process involves the steps of extracting tantalum metal preferably in the form a powder from ore containing tantalum and preferably the ore-containing tantalum selected has low amounts of impurities, especially, low amounts of niobium, molybdenum, and tungsten. More preferably, the amount of niobium, molybdenum, and tungsten is below about 10 ppm, and most preferably is below about 8 ppm. Such a selection leads to a purer tantalum metal. After the refining process, the vacuum melting process is used to purge low melting point impurities, such as alkydes and transition metals from the tantalum while consolidating the tantalum material into a fully dense, malleable ingot. Then, after this process, the ingot can be mechanically worked, which helps to break-up the as-cast grain structure, to a size and form appropriate for extrusion.

The high purity tantalum metal preferably may be made by reacting a salt-containing tantalum with at least one agent (e.g., compound or element) capable of reducing this salt to the tantalum metal and further results in the formation of a second salt in a reaction container. The reaction container can be any container typically used for the reaction of metals and should withstand high temperatures on the order of about 800° C. to about 1,200° C. For purposes of the present invention, the reaction container or the liner in the reaction container, which comes in contact with the salt-containing tantalum and the agent capable of reducing the salt to tantalum, is made from a material having the same or higher vapor pressure as tantalum at the melting point of the tantalum. The agitator in the reaction container can be made of the same material or can be lined as well. The liner can exist only in the portions of the reaction container and agitator that come in contact with the salt and tantalum. Examples of such metal materials which can form the liner or reaction container include, but are not limited to, metal-based materials made from nickel, chromium, iron, manganese, titanium, zirconium, hafnium, vanadium, ruthenium, cobalt, rhodium, palladium, platinum, or any combination thereof or alloy thereof as long as the alloy material has the same or higher vapor pressure as the melting point of tantalum metal. Preferably, the metal is a nickel or a nickel-based alloy, a chromium or a chromium-based alloy, or an iron or an iron-based alloy. The liner, on the reaction container and/or agitator, if present, typically will have a thickness of from about 0.5 cm to about 3 cm. Other thicknesses can be used. It is within the bounds of the present invention to have multiple layers of liners made of the same or different metal materials described above.

The salt-containing tantalum can be any salt capable of having tantalum contained therein such as a potassium-fluoride tantalum. With respect to the agent capable of reducing the salt to tantalum and a second salt in the reaction container, the agent which is capable of doing this reduction is any agent which has the ability to result in reducing the salt-containing tantalum to just tantalum metal and other ingredients (e.g. salt(s)) which can be separated from the tantalum metal, for example, by dissolving the salts with water or other aqueous sources. Preferably, this agent is sodium. Other examples include, but are not limited to, lithium, magnesium, calcium, potassium, carbon, carbon monoxide, ionic hydrogen, and the like. Typically, the second salt which also is formed during the reduction of the salt-containing tantalum is sodium fluoride. Details of the reduction process which can be applied to the present invention in view of the present application are set forth in Kirk-Othmer, Encyclopedia of Chemical Technology, 3rd Edition, Vol. 22, pp. 541-564, U.S. Pat. Nos. 2,950,185; 3,829,310; 4,149,876; and 3,767,456. Further details of the processing of tantalum can be found in U.S. Pat. Nos. 5,234,491; 5,242,481; and 4,684,399. All of these patents and publications are incorporated in their entirety by reference herein.

The above-described process can be included in a multi-step process which can begin with low purity tantalum, such as ore-containing tantalum. One of the impurities that can be substantially present with the tantalum is niobium. Other impurities at this stage are tungsten, silicon, calcium, iron, manganese, etc. In more detail, low purity tantalum can be purified by mixing the low purity tantalum which has tantalum and impurities with an acid solution. The low purity tantalum, if present as an ore, should first be crushed before being combined with an acid solution. The acid solution should be capable of dissolving substantially all of the tantalum and impurities, especially when the mixing is occurring at high temperatures.

Once the acid solution has had sufficient time to dissolve substantially all, if not all, of the solids containing the tantalum and impurities, a liquid solid separation can occur which will generally remove any of the undissolved impurities. The solution is further purified by liquid-liquid extraction. Methyl isobutyl ketone (MIBK) can be used to contact the tantalum rich solution, and deionized water can be added to create a tantalum fraction. At this point, the amount of niobium present in the liquid containing tantalum is generally below about 25 ppm.

Then, with the liquid containing at least tantalum, the liquid is permitted to crystallize into a salt with the use of vats. Typically, this salt will be a potassium tantalum fluoride salt. More preferably, this salt is $K_2TaF_7$. This salt is then reacted with an agent capable of reducing the salt into 1) tantalum and 2) a second salt as described above. This compound will typically be pure sodium and the reaction will occur in a reaction container described above. As stated above, the second salt byproducts can be separated from the tantalum by dissolving the salt in an aqueous source and washing away the dissolved salt. At this stage, the purity of the tantalum is typically 99.50 to 99.99% Ta.

Once the tantalum powder is extracted from this reaction, any impurities remaining, including any contamination from the reaction container, can be removed through melting of the tantalum powder.

The tantalum powder can be melted a number of ways such as a vacuum arc remelt or an electron beam melting. Generally, the vacuum during the melt will be sufficient to remove substantially any existing impurities from the recovered tantalum so as to obtain high purity tantalum. Preferably, the melting occurs in a high vacuum such as $10^{-4}$ torr or more. Preferably, the pressure above the melted tantalum is lower than the vapor pressures of the metal impurities in order for these impurities, such as nickel and iron to be vaporized. The diameter of the cast ingot should be as large as possible, preferably greater than 9½ inches. The large diameter assures a greater melt surface to vacuum interface which enhances purification rates. In addition, the large ingot diameter allows for a greater amount of cold work to be imparted to the metal during processing, which improves the attributes of the final products. Once the mass of melted tantalum consolidates, the ingot formed will have a purity of 99.995% or higher and preferably 99.999% or higher. The electron beam processing preferably occurs at a melt rate of from about 300 to about 800 lbs. per hour using 20,000 to 28,000 volts and 15 to 40 amps, and under a vacuum of from about $1\times10^{-3}$ to about $1\times10^{-6}$ Torr. More preferably, the melt rate is from about 400 to about 600 lbs. per hour using from 24,000 to 26,000 volts and 17 to 36 amps, and under a vacuum of from about $1\times10^{-4}$ to $1\times10^{-5}$ Torr. With respect to the VAR processing, the melt rate is preferably of 500 to 2,000 lbs. per hour using 25-45 volts and 12,000 to 22,000 amps under a vacuum of $2\times10^{-2}$ to $1\times10^{-4}$ Torr, and more preferably 800 to 1200 lbs. per hour at from 30 to 60 volts and 16,000 to 18,000 amps, and under a vacuum of from $2\times10^{-2}$ to $1\times10^{-4}$ Torr.

The resulting high purity metal ingot preferably has 10 ppm or less metallic impurities and preferably 50 ppm or less O2, 25 ppm or less N2, and 25 ppm or less carbon. If a purity level of about 99.995 is desired, than the resulting high purity metal preferably has metallic impurities of about 50 ppm or less, and preferably 50 ppm or less O2, 25 ppm or less N2, and 25 ppm or less carbon. This ingot can then be used in the manner described above to form the tantalum billets of the present invention.

As stated earlier, alternatively, niobium billets can be made following the above-described extruding details: Accordingly, a niobium billet having a substantially uniform grain size is obtained. The preferred parameters for the grain size and other characteristics are the same as for the tantalum parameters provided above, taking into account the different melting temperature and other working conditions of niobium (e.g., extruding at lower temperatures, such as from about 1000° C. to about 1650° C.) that are known to those skilled in the art.

The present invention will be further clarified by the following examples, which are intended to be exemplary of the present invention.

EXAMPLES

Two tantalum production ingots produced by triple Electron Beam (3EB) melting were fabricated into 3.75" diameter billets by different processing methods. An ingot identified "Commercial Process" was a 12" diameter ingot weighing 3476 pounds. Chemistry results from samples taken from the top, middle, and bottom of the ingot are provided in FIGS. 2(A) and 2(B). The ingot was manufactured into 3.75" diameter rod using standard commercial process shown in FIG. 1. A sample slice, approximately ½" thick by machined diameter was cut from a billet taken from a position representing the middle portion of the forged product. The sample slice was annealed in a vacuum of at least $5 \times 10^{-4}$ torr for 2 hours. Metallographic specimens representing longitudinal cross-sections of the center and edge of the sample slice were polished in accordance to standard metallographic procedures, and etched in a solution to $50HF-50HNO_3$ for 30-60 seconds. Results of the metallographic examination of the commercially produced tantalum billet product are summarized in FIGS. 2(A) and 2(B).

An ingot of the present invention was a 10" diameter ingot weighing 3734 pounds. Chemistry results from samples taken from the top, middle, and bottom sections of the ingot are also included in FIGS. 2(A) and 2(B), by reference to Φ and extrusion temperature. This second ingot was cut into 4 sections approximately 20" long and designated A, B, C, and D. Sections A-D were portioned from the bottom to the top of the ingot, respectively, and hot extruded as described below and shown in FIGS. 1 and 2(A-B):

Process A: Ingot Section A, Machined to 8.9" diameter, Canned in Copper, Soaked at 1800° F. for 6 hours, Extruded from a 9.5" liner through 4.0" diameter die.
Process B: Ingot Section B, Machined to 8.9" diameter, Canned in Copper, Soaked at 1850° F. for 6 hours, Extruded from a 9.5" liner through 4.0" diameter die.
Process C: Ingot Section C, Machined to 8.9" diameter, Canned in Copper, Soaked at 1900° F. for 6 hours, Extruded from a 9.5" liner through 4.0" diameter die.
Process D: Ingot Section D, Machined to 9.5" diameter, Canned in Copper, Soaked at 1900° F. for 6 hours, Extruded from a 10.25" liner through 4.0" diameter die.

Sample slices, each approximately ½" thick by machined diameter were cut from the center portion of each extruded rod. Each sample slide was cut into wedges, and a wedge from each extruded rod was annealed in a vacuum of at least $5 \times 10^{-4}$ torr for 2 hours at temperatures of 950, 1050, and 1150° C. Metallographic specimens representing longitudinal cross-sections of the center and edge of the sample slice were polished in accordance to standard metallographic procedures, then etched in a solution to $50HF-50HNO_3$ for 30-60 seconds. Results of the metallographic examination of the extruded tantalum billet products are included in FIGS. 2(A) and 2(B).

Figure 3A:
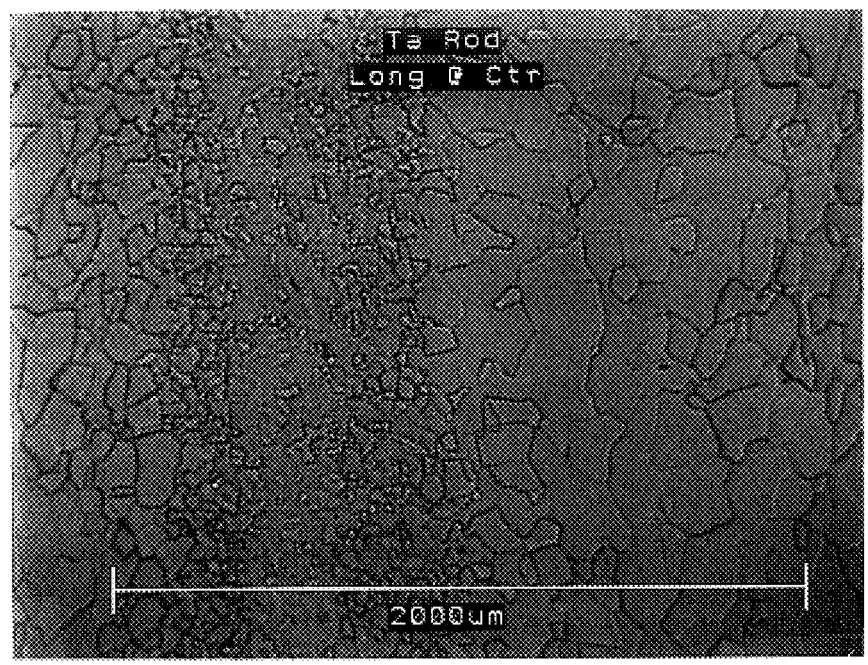
FIGS. 3(A-B)-9(A-B) are photomicrographs showing the grain structure of various samples used and/or prepared in the examples of the present application.
Figure 3B:
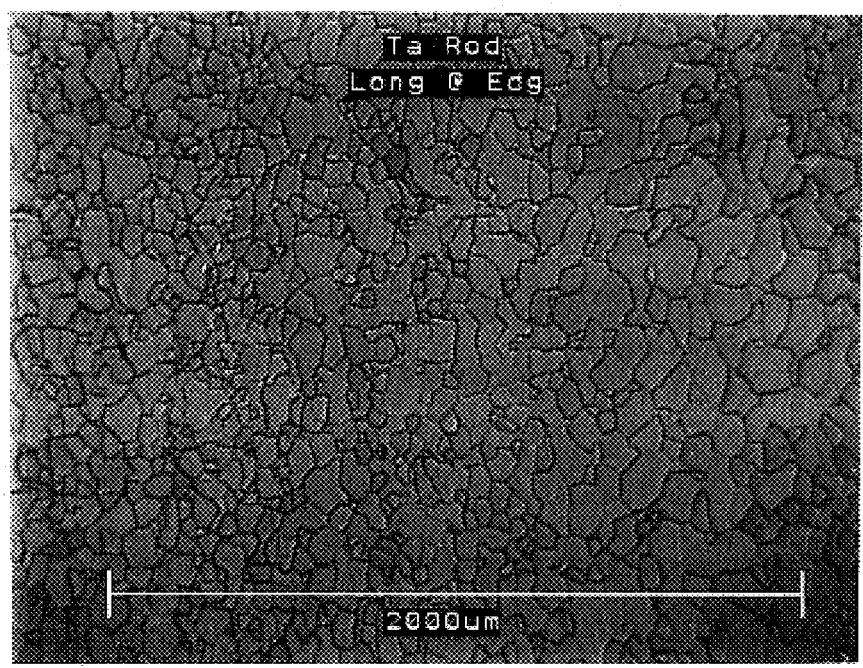
Figure 4A:
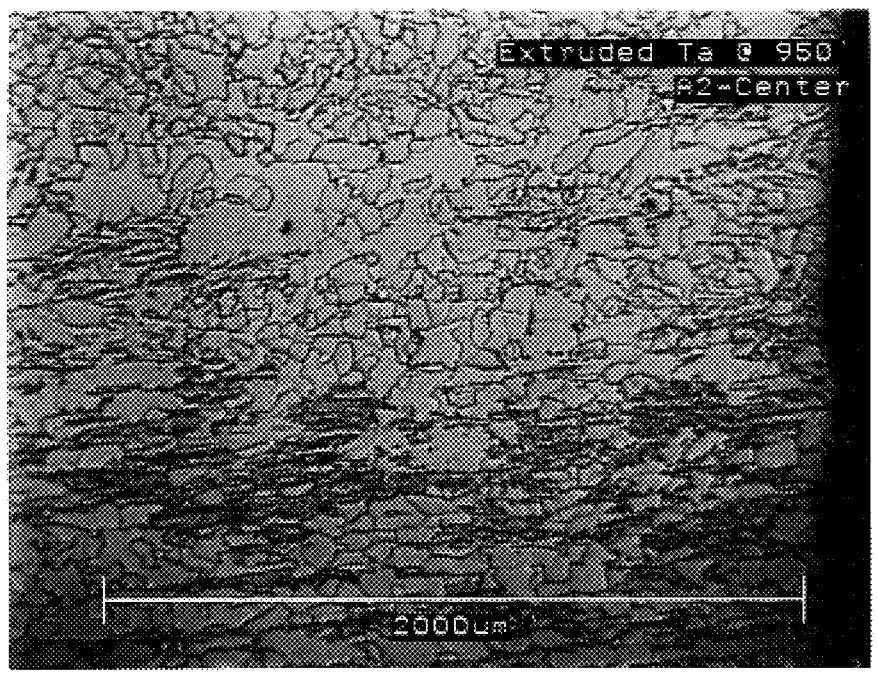
Figure 4B:
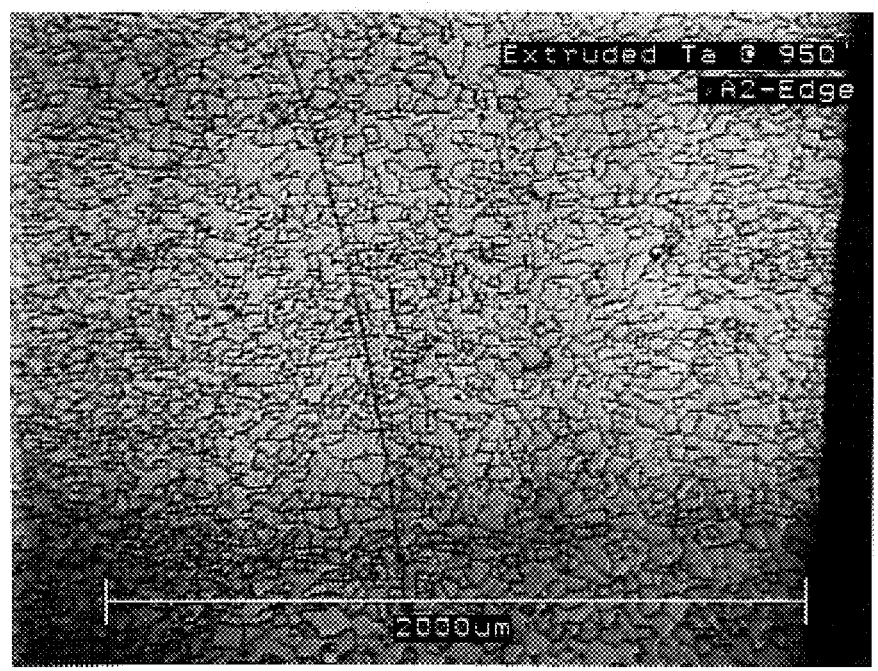
Figure 5A:
Figure 5B:

Photomicrographs showing the grain structure along the longitudinal plane at the center and edge regions of the commercially produced billet are shown in FIGS. 3(A) and 3(B). Here, the billet axis is perpendicular to the micron scale on the images. FIGS. 3(A) and 3(B) show many of the issues associated with the microstructure of commercially produced tantalum billet. First, the center of the billet contains a duplex grain structure comprised of broad bands of unrecrystallized material containing small islands of crystallites adjacent to regions containing large, elongated grains. The center of the commercial billet exhibited a grain size range from about 20 to about 245 µm., the largest range of grain size observed in all materials examined. Second, the grain structure character along the edge of the commercial billet was fully recrystallized and relatively uniform. This was significantly different than that in the center of the billet, and reflected the microstructural inhomogeneity seen in commercially produced tantalum billets.

Photomicrographs showing the center and edge section of extruded rod A, annealed at 950, 1050, and 1150° C., are provided in FIGS. 4(A) and 4(B), 5(A) and 5(B), and 6(A) and 6(B), respectively. Comparing the images in FIGS. 4-6 demonstrate the general effect of annealing temperature on the microstructure. The grain size character seen in FIGS. 4(A) and 4(B) were similar to that observed in the commercial billet, but with noticeably lesser amount of duplexing. In general, increasing the annealing temperature from 950 to 1050° C. did not dramatically increase the average grain size of the extruded tantalum billets, but did enhance grain size uniformity and percent recrystallization. An anneal temperature of 1150° C. did promote some grain growth without sacrificing uniformity in the extruded tantalum billets. The higher temperature anneal assured that the microstructure throughout the extruded tantalum billet was uniform and fully recrystallized.

Figure 6A:
Figure 6B:
Figure 7A:
Figure 7B:
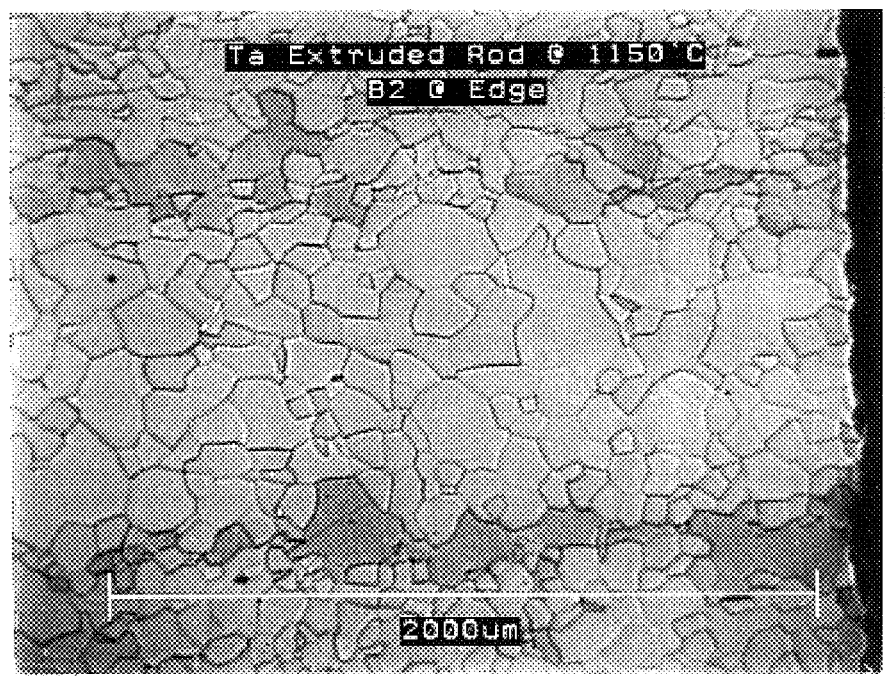
Figure 8A:
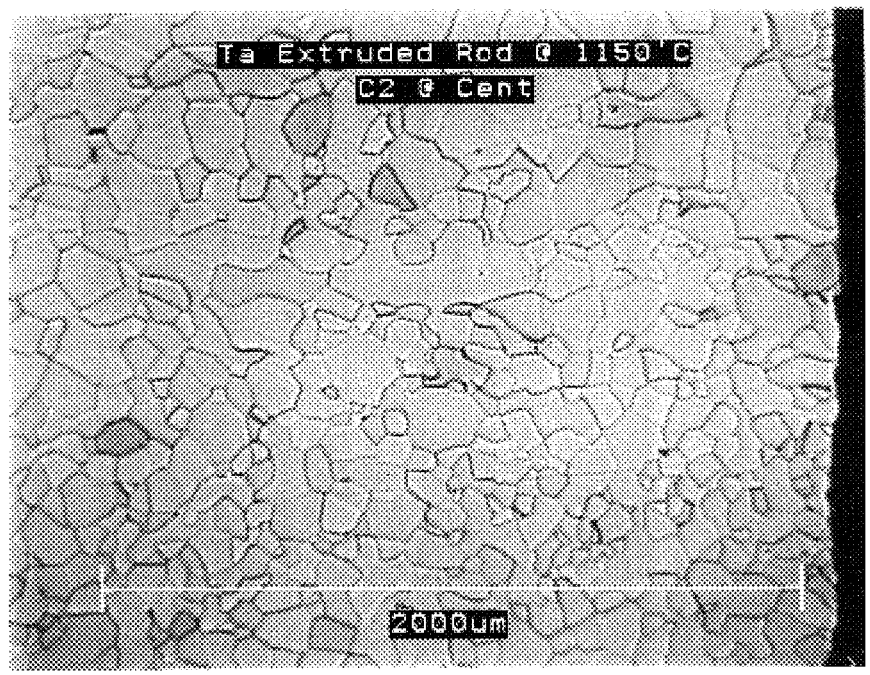
Figure 8B:
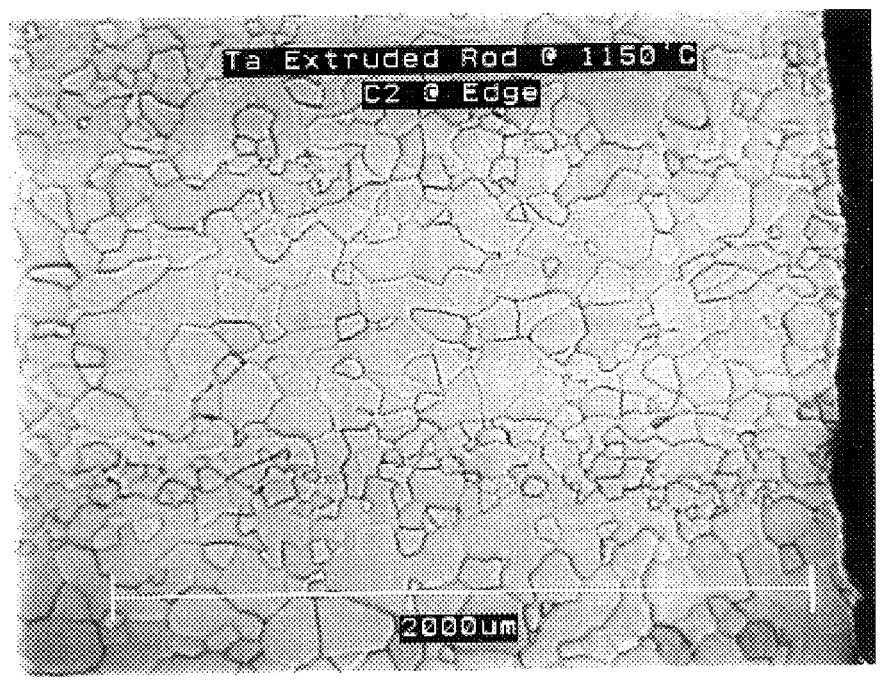
Figure 9A:
Figure 9B:

Photomicrographs of the center and edge regions of extruded billets A, B, C, and D, each annealed at 1150° C. for 2 hours, are given in FIGS. 6(A) and (B), 7(A) and (B), 8(A) and (B), and 9(A) and (B), respectively. Together, FIGS. 6-9 reveal the influence of extrusion temperature and billet size on the grain structure of the extruded tantalum billet. For the 8.9" diameter ingot sections extruded from a 9.5" diameter liner and annealed at 1150° C. for 2 hours, increasing the extrusion temperature from 1800 to 1900° F. had a slight effect on increasing the grain size and enhancing grain size uniformity. This trend shows that increasing the extrusion temperature increases the uniformity of deformation and stored energy in the material imparted during extrusion. However, for a 1900° F. extrusion temperature, increasing the diameter of the ingot section from 8.9 to 9.5" and extrusion liner from 9.5 to 10.25" diameter produced a billet product having an equal or finer average grain size and similar grain size uniformity. This observation demonstrates that increasing the pre-extruded ingot diameter allows for a greater amount of stored energy to be imparted to the extruded billet.

Together, the information developed in this example concludes that the optimum process involves extruding large 9.5" diameter tantalum ingot sections at a temperature of 1900° F. to produce a 4" diameter as-extruded rod that can machined into 3.75" diameter billets. A fully recrystallized and relatively uniform microstructure having an average grain size below 100 µm across the entire cross section of the billet is achieved after annealing the extruded tantalum billet at a temperature of 1050-1150° C.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A process for making an extruded tantalum billet, comprising extruding a tantalum ingot having a cylindrical shape having a cross section with a diameter of 6 inches to about 14 inches and having a metal purity of at least 99.99% at a sufficient temperature and for a sufficient time to at least partially recrystallize the tantalum billet during extrusion and form said extruded tantalum billet having a cylindrical shape with an aspect ratio L/D greater than 0.5 with a reduced diameter of 3½ inches or greater and a substantially uniform grain size throughout the cross section of the extruded tantalum billet from said extruding, and said extruded tantalum billet has an average grain size throughout the cross section of the extruded tantalum billet of about 150 microns or less, and said extruded tantalum billet is about 98% or more recrystallized.

2. The process of claim 1, wherein said sufficient temperature is from about 1200° F. to about 2950° F.

3. The process of claim 1, wherein said temperature is uniform throughout the extrusion process.

4. The process of claim 1, further comprising the step of water quenching the extruded tantalum billet after extrusion.

5. The process of claim 1, further comprising machine cleaning the extruded tantalum billet.

6. A process for making an extruded tantalum billet, comprising extruding a starting tantalum billet having a cylindrical shape having a cross section with a diameter of 6 inches to about 14 inches and having a metal purity of at least 99.99% at a sufficient temperature and for a sufficient time to at least partially recrystallize the tantalum billet to form said extruded tantalum billet having a cylindrical shape with an aspect ratio L/D greater than 0.5 with a reduced diameter of 3½ inches or greater and a substantially uniform grain size throughout the cross section of the extruded tantalum billet from said extruding, and said extruded tantalum billet has an average grain size throughout the cross section of the extruded tantalum billet of about 150 microns or less, and said extruded tantalum billet is about 98% or more recrystallized.

7. The process of claim 6, wherein said sufficient temperature is from about 1200° F. to about 2950° F.

8. The process of claim 6, wherein said temperature is uniform throughout the extrusion process.

9. The process of claim 6, further comprising the step of water quenching the extruded tantalum billet after extrusion.

10. The process of claim 6, further comprising machine cleaning the extruded tantalum billet.

11. A process for making an extruded tantalum billet comprising cutting an ingot into at least one starting billet having a cylindrical shape having a cross section with a diameter of 6 inches to about 14 inches and having a metal purity of at least 99.99% and either applying a protective coating on said starting billet or placing said starting billet in a can;

extruding the starting billet at a sufficient temperature and for a sufficient time to at least partially recrystallize the tantalum billet and to form said extruded tantalum billet having a cylindrical shape with an aspect ratio L/D greater than 0.5 with a reduced diameter of 3½ inches or greater and a substantially uniform grain size throughout the cross section of the extruded tantalum billet from said extruding, and said extruded tantalum billet has an average grain size throughout the cross section of the extruded tantalum billet of about 150 microns or less, and said extruded tantalum billet is about 98% or more recrystallized.

12. The process of claim 11, wherein said sufficient temperature is from about 1200° F. to about 2950° F.

13. The process of claim 11, wherein said temperature is uniform throughout the extrusion process.

14. The process of claim 11, further comprising the step of water quenching the extruded tantalum billet after extrusion.

15. The process of claim 11, further comprising machine cleaning the extruded tantalum billet.

16. The process of claim 11, wherein said ingot is obtained by the electron beam melting of a high purity tantalum powder feedstock.

17. The process of claim 11, wherein said protective coating or can is removed after said extruding.

18. The process of claim 17, wherein said protective coating is removed by acid washing or machine cleaning, or both.

19. A process for making an extruded tantalum billet comprising extruding a tantalum ingot having a cylindrical shape having a cross section with a diameter of 6 inches to about 14 inches and having a metal purity of at least 99.99% to form an extruded tantalum billet and then annealing said extruded tantalum billet at a sufficient temperature and for a sufficient time to at least partially recrystallize the extruded tantalum billet and form said extruded tantalum billet having a cylindrical shape with an aspect ratio L/D greater than 0.5 with a reduced diameter of 3½ inches or greater and a substantially uniform grain size throughout the cross section of the extruded tantalum billet from said extruding, and said extruded tantalum billet has an average grain size throughout the cross section of the extruded tantalum billet of about 150 microns or less, and said extruded tantalum billet is about 98% or more recrystallized.

20. A process for making an extruded tantalum billet comprising extruding a starting tantalum billet having a cylindrical shape having a cross section with a diameter of 6 inches to about 14 inches and having a metal purity of at least 99.99% to form said extruded tantalum billet and then annealing said extruded tantalum billet for a sufficient time and for a sufficient temperature to at least partially recrystallize the extruded tantalum billet and form said extruded tantalum billet having a cylindrical shape with an aspect ratio L/D greater than 0.5 with a reduced diameter of 3½ inches or greater and a substantially uniform grain size throughout the cross section of the extruded tantalum billet from said extruding, and said extruded tantalum billet has an average grain size throughout the cross section of the extruded tantalum billet of about 150 microns or less, and said extruded tantalum billet is about 98% or more recrystallized.

21. A process for making an extruded tantalum billet comprising cutting an ingot into at least one starting billet having a cylindrical shape having a cross section with a diameter of 6 inches to about 14 inches and having a metal purity of at least 99.99% and either applying a protective coating on said starting billet or placing said starting billet in a can;

extruding the starting billet to form said extruded tantalum billet and then annealing said extruded tantalum billet at a sufficient temperature and for a sufficient time to at least partially recrystallize the extruded tantalum billet and form said extruded tantalum billet having a cylindrical shape with an aspect ratio L/D greater than 0.5 with a reduced diameter of 3½ inches or greater and a substantially uniform grain size throughout the cross section of the extruded tantalum billet from said extruding, and said extruded tantalum billet has an average grain size throughout the cross section of the extruded tantalum billet of about 150 microns or less, and said extruded tantalum billet is about 98% or more recrystallized.

22. A process for making an extruded niobium billet, comprising extruding a niobium ingot having a cylindrical shape having a cross section with a diameter of 6 inches to about 14 inches and having a metal purity of at least 99.99% to form said extruded niobium billet, wherein said extruding is at a sufficient temperature and for a sufficient time to at least partially recrystallize the niobium billet during extrusion and said extruding forms said extruded niobium billet having a cylindrical shape with an aspect ratio L/D greater than 0.5 with a reduced diameter of 3½ inches or greater and a substantially uniform grain size throughout the cross section of the extruded niobium billet from said extruding, and said extruded niobium billet has an average grain size throughout the cross section of the extruded niobium billet of about 150 microns or less, and said extruded niobium billet is about 98% or more recrystallized.

23. The process of claim 22, wherein said sufficient temperature is from about 1000° F. to about 2650° F.

24. The process of claim 22, wherein said temperature is uniform throughout the extrusion process.

25. The process of claim 22, further comprising the step of water quenching the extruded niobium billet after extrusion.

26. The process of claim 22, further comprising machine cleaning the extruded niobium billet.

27. A process for making an extruded niobium billet, comprising extruding a starting niobium billet having a cylindrical shape having a cross section with a diameter of 6 inches to about 14 inches and having a metal purity of at least 99.99% at a sufficient temperature and for a sufficient time to at least partially recrystallize the niobium billet and form said extruded niobium billet having a cylindrical shape with an aspect ratio L/D greater than 0.5 with a reduced diameter of 3½ inches or greater and a substantially uniform grain size throughout the cross section of the extruded niobium billet from said extruding, and said extruded niobium billet has an average grain size throughout the cross section of the extruded niobium billet of about 150 microns or less, and said extruded niobium billet is about 98% or more recrystallized.

28. The process of claim 27, wherein said sufficient temperature is from about 1000° F. to about 2650° F.

29. The process of claim 27, wherein said temperature is uniform throughout the extrusion process.

30. The process of claim 27, further comprising the step of water quenching the extruded niobium billet after extrusion.

31. The process of claim 27, further comprising machine cleaning the extruded niobium billet.

32. A process for making an extruded niobium billet, comprising cutting an ingot into at least one starting billet having a cylindrical shape having a cross section with a diameter of 6 inches to about 14 inches and having a metal purity of at least 99.99% and either applying a protective coating on said starting billet or placing said starting billet in a can;
extruding the starting billet at a sufficient temperature and for a sufficient time to at least partially recrystallize the niobium billet and form said extruded niobium billet having a cylindrical shape with an aspect ratio L/D greater than 0.5 with a reduced diameter of 3½ inches or greater and a substantially uniform grain size throughout the cross section of the extruded niobium billet from said extruding, and said extruded niobium billet has an average grain size throughout the cross section of the extruded niobium billet of about 150 microns or less, and said extruded niobium billet is about 98% or more recrystallized.

33. The process of claim 32, wherein said sufficient temperature is from about 1000° F. to about 2650° F.

34. The process of claim 32, wherein said temperature is uniform throughout the extrusion process.

35. The process of claim 32, further comprising the step of water quenching the extruded niobium billet after extrusion.

36. The process of claim 32, further comprising machine cleaning the extruded niobium billet.

37. The process of claim 32, wherein said ingot is obtained by the electron beam melting of a high purity niobium powder feedstock.

38. The process of claim 32, wherein said protective coating or can is removed after said extruding.

39. The process of claim 38, wherein said protective coating is removed by acid washing or machine cleaning, or both.

40. The process of claim 1, further comprising annealing said extruded tantalum billet.

41. The process of claim 40, wherein said annealing occurs at a temperature and for a time sufficient to at least partially recrystallize the extruded tantalum billet during annealing.

42. The process of claim 40, wherein said annealing occurs at a temperature of from about 1742° F. to about 2102° F. for about 2 hours.

43. The process of claim 6, further comprising annealing said extruded tantalum billet.

44. The process of claim 43, wherein said annealing occurs at a temperature and for a time sufficient to at least partially recrystallize the extruded tantalum billet during annealing.

45. The process of claim 43, wherein said annealing occurs at a temperature of from about 1742° F. to about 2102° F. for about 2 hours.

46. The process of claim 11, further comprising annealing said extruded tantalum billet.

47. The process of claim 46, wherein said annealing occurs at a temperature and for a time sufficient to at least partially recrystallize the extruded tantalum billet during annealing.

48. The process of claim 46, wherein said annealing occurs at a temperature of from about 1742° F. to about 2102° F. for about 2 hours.

49. The process of claim 22, further comprising annealing said extruded niobium billet.

50. The process of claim 49, wherein said annealing occurs at a temperature and for a time sufficient to at least partially recrystallize the extruded niobium billet during annealing.

51. The process of claim 49, wherein said annealing occurs at a temperature of from about 1742° F. to about 2102° F. for about 2 hours.

52. The process of claim 27, further comprising annealing said extruded niobium billet.

53. The process of claim 52, wherein said annealing occurs at a temperature and for a time sufficient to at least partially recrystallize the extruded niobium billet during annealing.

54. The process of claim 52, wherein said annealing occurs at a temperature of from about 1742° F. to about 2102° F. for about 2 hours.

55. The process of claim 32, further comprising annealing said extruded niobium billet.

56. The process of claim 55, wherein said annealing occurs at a temperature and for a time sufficient to at least partially recrystallize the extruded niobium billet during annealing.

57. The process of claim 55, wherein said annealing occurs at a temperature of from about 1742° F. to about 2102° F. for about 2 hours.

58. A process for making an extruded niobium billet, comprising extruding a niobium ingot having a cylindrical shape having a cross section with a diameter of 6 inches to about 14 inches and having a metal purity of at least 99.99% to form an extruded niobium billet and then annealing said extruded niobium billet at a sufficient temperature and for a sufficient time to at least partially recrystallize the extruded niobium billet and form said extruded niobium billet having a cylindrical shape with an aspect ratio L/D greater than 0.5 with a reduced diameter of 3½ inches or greater and a substantially uniform grain size throughout the cross section of the extruded niobium billet from said extruding, and said extruded niobium billet has an average grain size throughout the cross section of the extruded niobium billet of about 150 microns or less, and said extruded niobium billet is about 98% or more recrystallized.

59. A process for making an extruded niobium billet, comprising extruding a starting niobium billet having a cylindrical shape having a cross section with a diameter of 6 inches to about 14 inches and having a metal purity of at least 99.99% to form said extruded niobium billet and then annealing said extruded niobium billet for a sufficient time and for a sufficient temperature to at least partially recrystallize the extruded niobium billet and form said extruded niobium billet having a cylindrical shape with an aspect ratio L/D greater than 0.5 with a reduced diameter of 3½ inches or greater and a substantially uniform grain size throughout the cross section of the extruded niobium billet from said extruding, and said extruded niobium billet has an average grain size throughout the cross section of the extruded niobium billet of about 150 microns or less, and said extruded niobium billet is about 98% or more recrystallized.

60. A process for making an extruded niobium billet, comprising cutting an ingot into at least one starting billet having a cylindrical shape having a cross section with a diameter of 6 inches to about 14 inches and having a metal purity of at least 99.99% and either applying a protective coating on said starting billet or placing said starting billet in a can;

extruding the starting billet to form said extruded niobium billet and then annealing said extruded niobium billet at a sufficient temperature and for a sufficient time to at least partially recrystallize the extruded niobium billet and form said extruded niobium billet having a cylindrical shape with an aspect ratio L/D greater than 0.5 with a reduced diameter of 3½ inches or greater and a substantially uniform grain size throughout the cross section of the extruded niobium billet from said extruding, and said extruded niobium billet has an average grain size throughout the cross section of the extruded niobium billet of about 150 microns or less, and said extruded niobium billet is about 98% or more recrystallized.

\* \* \* \* \*